US 6,787,711 B2

(12) United States Patent
Kikuchi et al.

(10) Patent No.: US 6,787,711 B2
(45) Date of Patent: Sep. 7, 2004

(54) PRINTED WIRING BOARD DEVICE HAVING HEAT-ABSORBING DUMMY PARTS, AND METHOD OF MANUFACTURING THE PRINTED WIRING BOARD DEVICE

(75) Inventors: Shunichi Kikuchi, Kawasaki (JP); Mitsutaka Yamada, Kawasaki (JP); Kenji Iketaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 95 days.

(21) Appl. No.: 10/195,547

(22) Filed: Jul. 16, 2002

(65) Prior Publication Data

US 2003/0111262 A1 Jun. 19, 2003

(30) Foreign Application Priority Data

Dec. 14, 2001 (JP) ......................................... 2001-381326

(51) Int. Cl.$^7$ ........................... H05K 1/11; H01R 12/04

(52) U.S. Cl. ........................ 174/261; 174/252; 174/260; 361/688; 361/760; 361/704; 257/706

(58) Field of Search ................................ 174/252, 260, 174/261, 250; 361/760, 761, 688, 713, 767, 782, 783, 719, 706, 712, 720, 704; 257/706, 712

(56) References Cited

U.S. PATENT DOCUMENTS

| | | | | |
|---|---|---|---|---|
| 5,128,506 A | * | 7/1992 | Dahne et al. | 219/85.13 |
| 6,021,046 A | * | 2/2000 | McLellan et al. | 361/719 |
| 6,185,101 B1 | * | 2/2001 | Itabashi et al. | 361/704 |
| 6,281,573 B1 | * | 8/2001 | Atwood et al. | 257/706 |
| 6,453,537 B1 | * | 9/2002 | Heim et al. | 29/426.4 |

FOREIGN PATENT DOCUMENTS

| | | | | |
|---|---|---|---|---|
| JP | 402113512 A | * | 4/1990 | |
| JP | 7-37337 | | 8/1995 | |
| JP | 08088463 A | * | 4/1996 | |
| JP | 408213724 A | * | 8/1996 | |
| JP | 410022335 A | * | 1/1998 | |
| JP | 2001-85827 | | 3/2001 | |

* cited by examiner

*Primary Examiner*—David A Zarneke
*Assistant Examiner*—J B Patel
(74) *Attorney, Agent, or Firm*—Armstrong, Kratz, Quintos, Hanson & Brooks, LLP

(57) ABSTRACT

A printed wiring board device includes circuit parts which are mounted on a wiring board and constitute parts of a circuit in the printed wiring board device. Pads are provided on the wiring board in the circumference of the circuit parts, and the pads being electrically isolated from the circuit. Heat-absorbing dummy parts are mounted on the pads, and the dummy parts absorb heat from the circuit parts through the pads during reflow soldering.

10 Claims, 15 Drawing Sheets

FIG.8
(A) 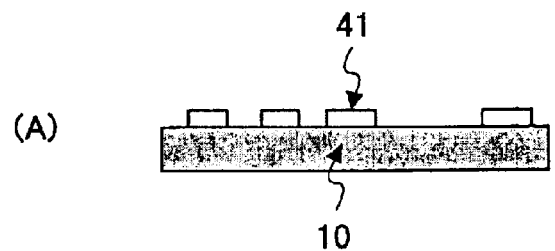
(B) 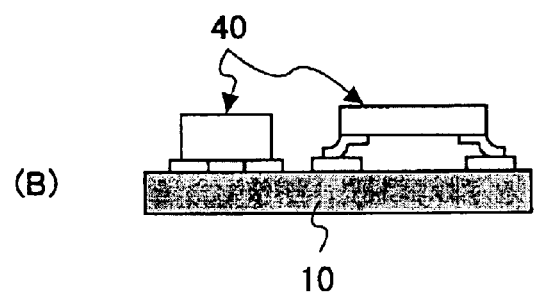
HEAT RADIATION AND CONVECTION
(C) 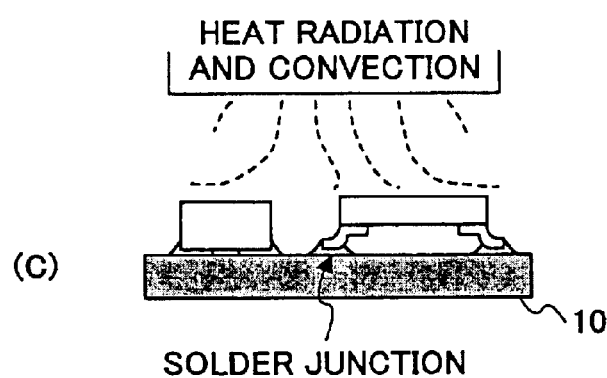
SOLDER JUNCTION
(D) 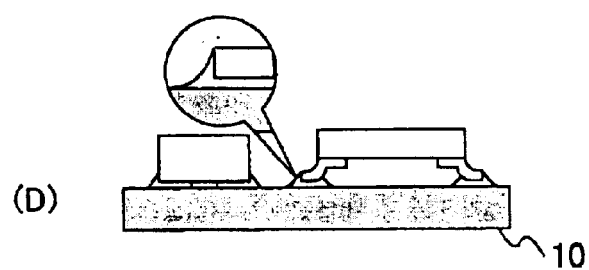

FIG.10

| CONDITION | SURROUNDING PARTS OF S-SOP | GAP | TEMP. OF PART (°C) | VOLUME (mm³) | DENSITY (kg/m³) |
|---|---|---|---|---|---|
| Q | COIL | 4mm | 220.0 | | |
| A | NONE | 4mm | 235.0 | – | – |
| B | SOP | 4mm | 230.0 | 31.2 | 2074 |
| C | CHIP | 4mm | 230.0 | 57.6 | 1915 |
| D | SUS | 4mm | 223.0 | 80.0 | 7920 |

| CONDITION | SPECIFIC HEAT (J/kg·K) | THERMAL CONDUCTIVITY (W/m·K) | ABSORPTION RATIO | HEAT CAPACITY OF DUMMY (J/K) | TEMP. REDUCTION (°C) |
|---|---|---|---|---|---|
| Q | | | | | |
| A | – | – | – | | 0.0 |
| B | 1010.92 | 5.73 | 0.932 | 0.26 | 5.0 |
| C | 1010.92 | 3.60 | 0.932 | 0.45 | 5.0 |
| D | 500.00 | 16.00 | 0.580 | 1.27 | 12.0 |

FIG.13

| CONDITION | SURROUNDING PARTS OF S-SOP (mm) | GAP | TEMP. OF PART (°C) | VOLUME (mm³) | DENSITY (kg/m³) |
|---|---|---|---|---|---|
| A | NONE | 4mm | 235.0 | – | – |
| B | SOP 6×4×1.3 | | 230.0 | 31.2 | 2074 |
| C | CHIP 6×4×2.4 | | 230.0 | 57.6 | 1915 |
| D | SUS 10×4×2.0 | | 223.0 | 80.0 | 7920 |
| E | Al 10×4×2.0 | | 228.0 | 80.0 | 2700 |
| F | SUS 10×4×2.0 | | 226.0 | 80.0 | 7920 |
| G | Cu 10×4×2.0 | | 224.0 | 80.0 | 8930 |
| H | SUS 2 10×4×2.0 | | 223.5 | 80.0 | 7920 |

| CONDITION | SPECIFIC HEAT (J/kg·K) | THERMAL CONDUCTIVITY (W/m·K) | ABSORPTION RATIO | HEAT CAPACITY OF DUMMY (J/K) | TEMP. REDUCTION (°C) |
|---|---|---|---|---|---|
| A | – | – | – | | |
| B | 1010.92 | 5.73 | 0.932 | 0.26 | 5.0 |
| C | 1010.92 | 3.60 | 0.932 | 0.45 | 5.0 |
| D | 500.00 | 16.00 | 0.580 | 1.27 | 12.0 |
| E | 903.00 | 160.00 | 0.180 | 0.78 | 7.0 |
| F | 500.00 | 16.00 | 0.580 | 0.95 | 9.0 |
| G | 385.00 | 393.00 | 0.500 | 1.10 | 11.0 |
| H | 500.00 | 10.00 | 0.580 | 1.27 | 11.5 |

PRINTED WIRING BOARD DEVICE HAVING HEAT-ABSORBING DUMMY PARTS, AND METHOD OF MANUFACTURING THE PRINTED WIRING BOARD DEVICE

BACKGROUND OF THE INVENTION

1. Field of the Invention

The present invention relates to a printed wiring board device on which solder junctions of individual parts are made by using reflow equipment, and to a method of manufacture of the printed wiring board device.

2. Description of the Related Art

In recent years, there is the trend of promoting the activities that do not use the toxic substances having undesired influences on the environment, with an increase of the concern about environmental problems. In the field of manufacture of printed wiring boards, such as electronic devices, the activities to eliminate the toxic lead substances that are derived from the conventional solder (e.g., 37 Pb—Sn eutectic alloy solder) are also promoted. The use of the unleaded solder that does not contain such lead substances is proposed for the field of manufacture of printed wiring boards, instead of the leaded solder.

From the standpoint of chip packaging techniques, if the leaded solder (the eutectic alloy solder) is replaced by the unleaded solder, the melting point of the unleaded solder is raised from 183 deg. C. that is the melting point of the eutectic alloy solder. For example, the melting point of the Sn—Zn unleaded solder goes up to 200 deg. C., and the melting point of the Sn—Ag—Cu unleaded solder goes up to 217–221 deg. C. In connection with this, the mounting temperature that ensures good solder junctions in the case of the unleaded solder is also raised by about 10–20 deg. C. from 205 deg. C. that is the mounting temperature in the case of the leaded solder.

By the rise of the mounting temperature conditions for ensuring good solder junctions, the reliability of individual parts of the printed wiring board is significantly affected. Generally, the heat-resistant temperature of the printed wiring board parts varies depending on the composition material and size of the individual parts. Even if the leaded solder is replaced by the unleaded solder, the heat-resistant temperature remains unchanged. Hence, it is necessary to take measures to reduce the time to maintain the high temperature conditions as small as possible for the printed wiring board parts wherein the permissible temperature conditions are severe.

Especially when performing reflow soldering of a printed wiring board including isolated parts that are arranged at positions isolated from other parts (the non-isolated or thinly populated parts) on the wiring board, there is a problem in that, if the setting of the reflow equipment is adjusted to the temperature conditions that ensure good solder junctions for the non-isolated parts, the reflow heating temperature, created by the reflow equipment, exceeds a heat-resistant temperature of the isolated parts.

If the reflow heating temperature exceeds the heat-resistant temperature of the isolated parts, peeling or swelling of the resin layer at terminal connections in the isolated parts or the like will occur and a degradation of the performance over an extended period of time will be caused. For this reason, the conventional circuit parts should not be used without change. It is necessary to change the conventional circuit parts to special circuit parts using a composition material having a high thermal resistance or to improve the manufacturing processes by taking preventive measures against the peeling or swelling of the resin layer of the isolated parts.

Japanese Laid-Open Patent Application Nos. 2001-85827, 8-64953 and 8-236913 disclose improvements of pads and circuit patterns for a printed wiring board that is configured to suppress the temperature variations of the lead portion of each individual part on the printed wiring board to obtain the uniform temperature, and to suppress irregularities of solder junctions at the time of soldering.

Moreover, Japanese Published Utility Model Application No. 7-37337 discloses an electronic circuit chip in which dummy parts are provided. However, in this circuit chip, the dummy parts are provided in order to prevent the engagement between adjacent circuit chips when arranging the circuit chips in row into a cylindrical case and mounting the circuit chips on a printed circuit board by using an automatic mounting machine.

It should be noted that the conventional methods of the above-mentioned documents system do not take into consideration about preventive measures against such problem that the reflow heating temperature, created by the reflow equipment, exceeds the heat-resistant temperature of the isolated parts when the temperature conditions of the reflow equipment are made severer.

A conceivable method for improvement of the manufacturing processes is that a special jig is provided in order to prevent the heat concentration on specific circuit parts. However, it is difficult to carry out the temperature control with the use of the special jig while maintaining the accuracy of the temperature control reasonably high, and such improvement is disadvantageous with respect to the manufacture cost.

SUMMARY OF THE INVENTION

An object of the present invention is to provide an improved printed wiring board device in which the above-described problems are eliminated.

Another object of the present invention is to provide a printed wiring board device that prevents the temperature rise of the circuit parts during the reflow soldering from exceeding the heat-resistant temperature thereof, and maintains the circuit parts in proper temperature conditions, thereby ensuring that good solder junctions are made on the wiring board.

Another object of the present invention is to provide a method of manufacturing a printed wiring board device that prevents the temperature rise of the circuit parts during the reflow soldering from exceeding the heat-resistant temperature thereof, and maintains the circuit parts in proper temperature conditions, thereby ensuring that good solder junctions are made on the wiring board.

Another object of the present invention is to provide an information processing apparatus in which a printed wiring board device is provided, the printed wiring board device preventing the temperature rise of the circuit parts during the reflow soldering from exceeding the heat-resistant temperature thereof, and maintaining the circuit parts in proper temperature conditions, thereby ensuring that good solder junctions are made on the wiring board.

The above-mentioned objects of the present invention are achieved by a printed wiring board device comprising: circuit parts which are mounted on a wiring board and constitute parts of a circuit in the printed wiring board device; pads which are provided on the wiring board in the circumference of the circuit parts and electrically isolated from the circuit; and heat-absorbing dummy parts which are mounted on the pads and absorb heat from the circuit parts through the pads during reflow soldering.

The above-mentioned objects of the present invention are achieved by a printed wiring board device comprising: circuit parts which are mounted on a wiring board at positions isolated from other parts on the wiring board, the circuit parts constituting parts of a circuit in the printed wiring board device; and heat-absorbing dummy parts which are mounted on the wiring board by using an adhesive agent that is thermally conductive, the dummy parts absorbing heat from the circuit parts through the adhesive agent during reflow soldering.

The above-mentioned objects of the present invention are achieved by a method of manufacturing a printed wiring board device having circuit parts mounted on a wiring board and constituting parts of a circuit in the printed wiring board device, the method comprising steps of: providing pads on the wiring board in the circumference of the circuit parts such that the pads are electrically isolated from the circuit; applying a solder to the wiring board in accordance with a wiring pattern of the wiring board; mounting heat-absorbing dummy parts on the pads; and performing a reflow soldering of the printed wiring board device to produce solder junctions on the wiring board by using a reflow equipment, wherein the dummy parts absorbs heat from the circuit parts through the pads during the reflow soldering, thereby preventing an excessive temperature rise of the circuit parts.

The above-mentioned objects of the present invention are achieved by an information processing apparatus in which a printed wiring board device is provided, the printed wiring board device comprising: circuit parts which are mounted on a wiring board and constitute parts of a circuit in the printed wiring board device; pads which are provided on the wiring board in the circumference of the circuit parts and electrically isolated from the circuit; and heat-absorbing dummy parts which are mounted on the pads and absorb heat from the circuit parts through the pads during reflow soldering.

In the printed wiring board device of the present invention, the circuit parts are mounted on the wiring board and constitute parts of the circuit on the wiring board. The pads are provided on the wiring board in the circumference of the circuit parts and electrically isolated from the circuit. The heat-absorbing dummy parts are mounted on the pads and absorb heat from the circuit parts through the pads during the reflow soldering. Even if the circuit parts having a low thermal resistance are needed to be isolated from other parts on the wiring board, it is possible to prevent the temperature rise of the circuit parts during the reflow soldering from exceeding the heat-resistant temperature thereof. The printed wiring board device of the present invention is effective in maintaining the circuit parts in proper temperature conditions, and it can ensure that good solder junctions are made on the wiring board. The mounting of the dummy parts on the wiring board can be easily carried out, and it contributes to reduction of the manufacturing cost while it prevents the temperature rise of the circuit parts during the reflow soldering.

BRIEF DESCRIPTION OF THE DRAWINGS

Other objects, features and advantages of the present invention will become apparent from the following detailed description when read in conjunction with the accompanying drawings.

FIG. 8 is a diagram for explaining each of respective steps of the manufacture method shown in FIG. 7.

FIG. 10 is a diagram showing the surface temperature of the S-SOP and the physical properties of dummy parts in the vicinity of the S-SOP in each simulated result for a first example of the printed wiring board model.

FIG. 13 is a diagram showing the surface temperature of the S-SOP and the physical properties of dummy parts in the vicinity of the S-SOP in each simulated results of a second example of the printed wiring board model.

DETAILED DESCRIPTION OF PREFERRED EMBODIMENTS

A description will now be given of preferred embodiments of the present invention with reference to the accompanying drawings.

Figure 1:
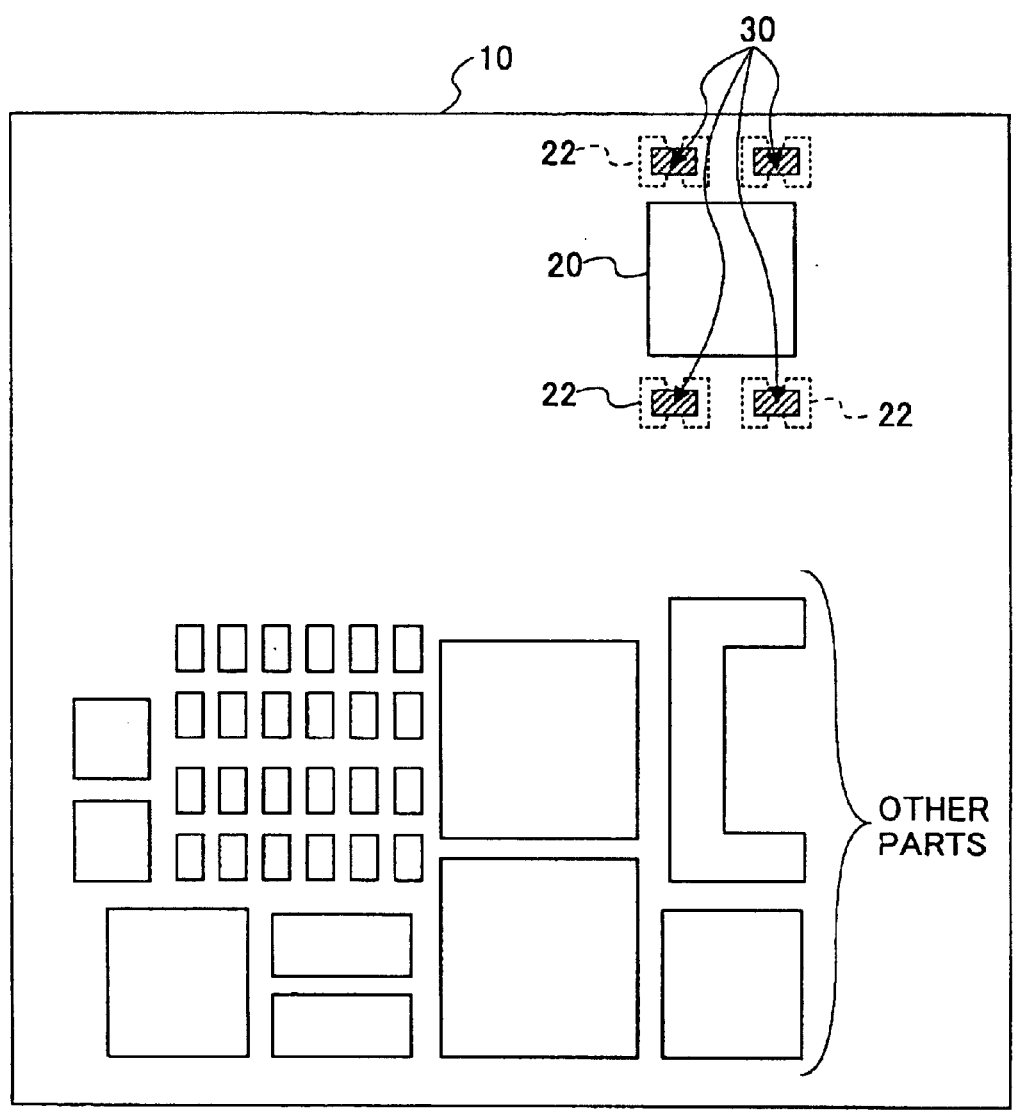
FIG. 1 is a plan view of one embodiment of the printed wiring board device of the present invention.

FIG. 1 shows one embodiment of the printed wiring board device of the present invention.

As shown in FIG. 1, in the printed wiring board device 10, a circuit part 20 is mounted on the wiring board at a position isolated from other parts on the wiring board. The circuit part 20 constitutes a part of a circuit in the printed wiring board device 10. A plurality of pads 22 (for part mounting) are provided on the wiring board in the vicinity of peripheral edges of the circuit part 20. The pads 22 are electrically isolated from the circuit in the printed wiring board device 10. Namely, there is no electrical connection between each pad 22 and the circuit. Further, heat-absorbing dummy parts 30 are mounted on the pads 22, and the dummy parts 30 efficiently absorb heat from the circuit part 20 through the pads 22 during reflow soldering.

In the present specification, it is supposed that the dummy parts are not circuit parts that constitute parts of a circuit in the printed wiring board device, but the dummy parts are provided on the wiring board adjacent to a circuit part in order to absorb or collect heat from the adjacent circuit part at the time of reflow soldering.

When determining the arrangement of parts on the wiring board, one may encounter the restrictions which require making wiring connections between a circuit part on the front surface and another part on the back surface or require the pulling out of wiring connections from the wiring board to an external device with the limitation of wiring length. In such cases, the necessity of the isolated circuit parts which are mounted on the wiring board at positions isolated from other parts thereon may arise. When the isolated circuit parts are arranged on the wiring board and the reflow soldering is performed with the printed wiring board device, it is necessary to take measures for maintaining the isolated circuit parts in proper temperature conditions and for ensuring good solder junctions being made thereon as previously described.

Figure 6:
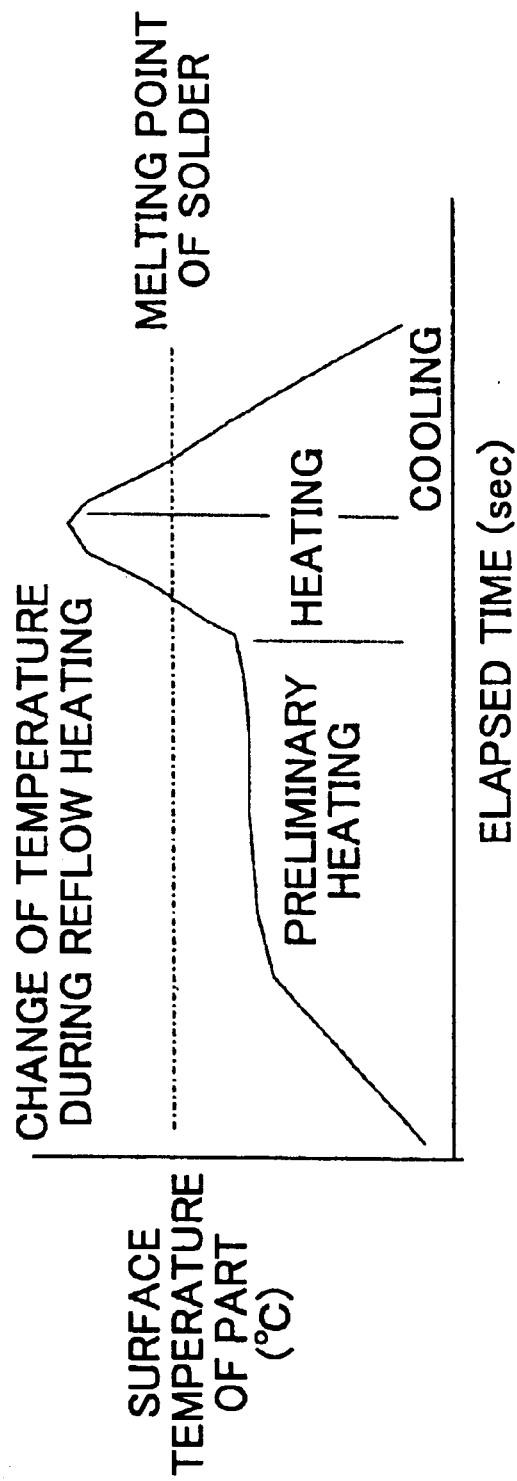
FIG. 6 is a diagram for explaining a change of the surface temperature of a component part on a printed wiring board device in accordance with the elapsed time during reflow heating.

FIG. 6 shows a change of the surface temperature of the circuit parts on the printed wiring board in accordance with the elapsed time during the reflow heating.

When the heating of a printed wiring board is started by using the reflow equipment, the surface temperature of the circuit parts on the printed wiring board is gradually raised in accordance with the elapsed time (preliminary heating). At the time when the surface temperature of the printed wiring board and the printed wiring board parts becomes almost uniform, the surface temperature is increased at a stretch so that all solder junctions on the wiring board are set to be higher than the melting point temperature (heating). In this state, the solder melting is attained so that the solder junctions between the individual parts on the wiring board are made. In addition, the temperature at which the surface temperature during the reflow heating is the maximum is called the peak temperature.

If the reflow soldering of the printed wiring board including the isolated parts is performed and the isolated parts have a low heat capacity, there is a problem in that the reflow heating temperature is rapidly raised and it may exceed the heat-resistant temperature of the isolated parts. Furthermore, when the leaded solder is changed to the unleaded solder, the melting point of the unleaded solder is raised from that of the leaded solder. In such a case, it is necessary to take measures for maintaining the isolated parts in a proper temperature range during the reflow heating, in order to prevent the peeling or swelling of the resin layer of the isolated parts.

Figure 4:
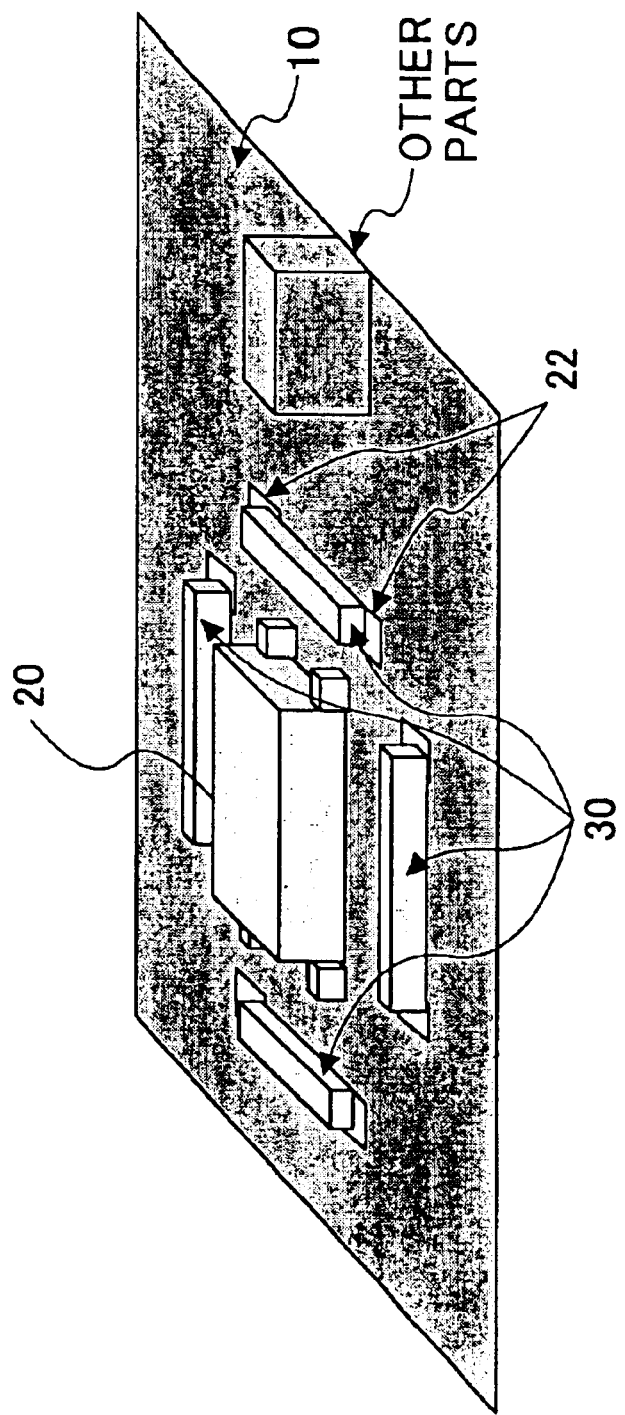
FIG. 4 is a perspective view of one embodiment of the printed wiring board device of the present invention.

FIG. 4 shows another embodiment of the printed wiring board device of the present invention.

As shown in FIG. 4, in the printed wiring board device 10 of the present embodiment, the circuit part 20 has a low heat resistance and is mounted on the wiring board at a position isolated from other parts on the wiring board. The circuit part 20 constitutes a part of a circuit in the printed wiring board device 10. Namely, the circuit part 20 is an isolated circuit part that is subjected to excessive heating at the time of reflow soldering of the printed wiring board device 10. A superfluous temperature rise of the isolated circuit part 20 which exceeds a heat-resistant temperature thereof is likely to take place during the reflow soldering. In the printed wiring board device 10 of the present embodiment, the preventive measures for preventing the excessive heating of the isolated circuit part 20 during the reflow soldering are taken, as described below.

As shown in FIG. 4, in the printed wiring board device 10 of the present embodiment, the plurality of pads 22, which are electrically isolated from the circuit formed by the circuit part 20, are disposed on the wiring board in the vicinity of the peripheral edges of the circuit part 20. The heat-absorbing dummy parts 30 are mounted on the pads 22. In the present embodiment, a superfluous temperature rise of the circuit part 20 during the reflow heating can be prevented by increasing the heat capacity per unit area in the vicinity of the isolated circuit part 20 by means of the dummy parts 30.

In the printed wiring board device 10 of the present embodiment, each dummy part 30 is mounted on the pads 22 which are not electrically connected with the circuit inside the printed wiring board device 10. Accordingly, even when the dummy parts 30 are added to the printed wiring board device 10, the influences of the dummy parts 20 on the internal circuit may be negligible.

In the present embodiment, the dummy parts 30 are permanently mounted on the pads 22 of the printed wiring board device 10. Alternatively, the dummy parts 30 may be provided removably onto the printed wiring board device 10. In such alternative embodiment, the dummy parts 30 can suppress the change to the current printed wiring board design at a necessary, minimum level, and it is advantageous in respect of the manufacture cost.

In the present embodiment, the dummy parts 30 are mounted in the circumference of one of the circuit parts (the circuit part 20 in FIG. 4) that receives during the reflow heating the largest amount of heat among the respective amounts of heat received by the circuit parts on the wiring board.

Generally, the heat capacity is defined as being a quantity of heat needed for a 1-degree temperature rise of the part concerned, and it can be computed as a product of the specific heat (J/kg-K) of the part, the density (kg/m$^3$) of the part and the volume (m$^3$) of the part. In order to prevent the excessive heating of the circuit part 20 during the reflow heating, it is necessary that the dummy parts 30 have a sufficiently large heat capacity in comparison with the heat-resistant temperature of the circuit part 20. It is preferred that the dummy parts 30 are configured so that they have a sufficiently large thermal conductivity as well as a sufficiently large heat capacity in comparison with the heat-resistant temperature of the circuit part 20. By arranging the plurality of such dummy parts 30 in the vicinity of the peripheral edges of the circuit part 20, it is possible to increase the effects that prevent the excessive heating of the circuit part 20 during the reflow heating.

The dummy parts 30 having a large thermal conductivity promote the flow of heat from the external surfaces of the dummy parts 30 to the inside thereof, and the dummy parts 30 efficiently absorb the heat from the circuit part 20 during the reflow heating because they have a large heat capacity. Hence, it is possible for the printed wiring board device 10 of the present embodiment to prevent the temperature rise of the circuit part 20 during the reflow soldering from exceeding the heat-resistant temperature of the circuit part 30.

The composition material of the dummy parts 30 that is suitable for the above purpose is one of ceramics (such as alumina), copper, an aluminum alloy, etc. If it is ensured that the dummy parts have a sufficiently large heat capacity, a metallic material, such as a stainless material, may be used as the suitable composition material of the dummy parts 30. When a ceramic material is selected as being the composition material of the dummy parts 30, chip capacitors or chip resistors may be used as the dummy parts 30. When a metallic material is selected as being the composition material of the dummy parts 30, it is desirable that the dummy parts 30 are fixed to the wiring board by using an adhesive agent or a mechanical junction.

In the printed wiring board device 10 of the above embodiment of FIG. 1 or FIG. 4, the plurality of pads 22 that are not electrically connected with the circuit inside the printed wiring board device 10 are mounted in the vicinity of the circuit parts 20. The present invention is not limited to this embodiment. Alternatively, without mounting the pads 22 on the printed wiring board device 10, it is possible to prevent the excessive heating of the circuit parts 20 during the reflow soldering. For example, by using a thermally conductive adhesive agent, the dummy parts 30 are fixed to the wiring board in the vicinity of the circuit parts 20 without using the pads 22. In such alternative embodiment, the dummy parts 30 serve to absorb the heat from the circuit parts 20 through the adhesive agent during the reflow heating.

Moreover, in order for the dummy parts 30 to absorb the heat from the circuit parts 20 more efficiently, it is desirable that the surfaces of the dummy parts 30 are colored substantially in black by painting or surface treatment.

Figure 2:
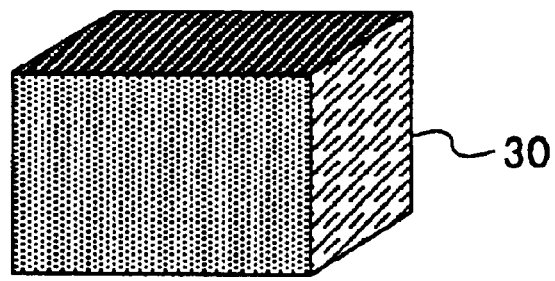
FIG. 2 is a diagram showing an example of the dummy part according to the present invention.

FIG. 2 shows an example of the dummy part according to the present invention. As shown in FIG. 2, the dummy part 30 of this example is configured in a rectangular parallelepiped form. However, the form of the dummy parts 30 is not limited to this example. Alternatively, the dummy parts 30 according to the present invention may be configured in a pillar-like form or a variant-like form. Such examples of the dummy parts 30 have no significant differences with respect to the effect to prevent the excessive heating of the circuit parts 20 during the reflow soldering.

Figure 3:
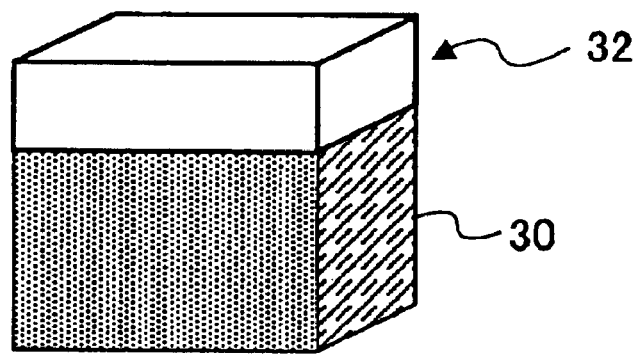
FIG. 3 is a diagram showing another example of the dummy part according to the present invention.

FIG. 3 shows another example of the dummy part 30 according to the present invention. When the areas of the surfaces of the circuit parts 20 are relatively large, it is difficult to control the rising of the surface temperature of the circuit parts 20 only with the heat capacity of the dummy parts 30. In such a case, as shown in FIG. 3, a heat-absorption part 32 (for example, a metal part) which has a sufficiently large thermal conductivity in comparison with the heat-resistant temperature of the circuit parts 20 is attached to the surface of each dummy part 30 by using an adhesive agent or a mechanical junction. By attaching the heat-absorption part 32 to the dummy part surface, the heat absorption effect of the dummy part 30 with the heat-absorption part 32 can be increased. Hence, when the areas of the surfaces of the circuit parts 20 are relatively large, the effect which prevents the excessive heating of the circuit parts 20 during the reflow soldering can be increased.

Figure 5:
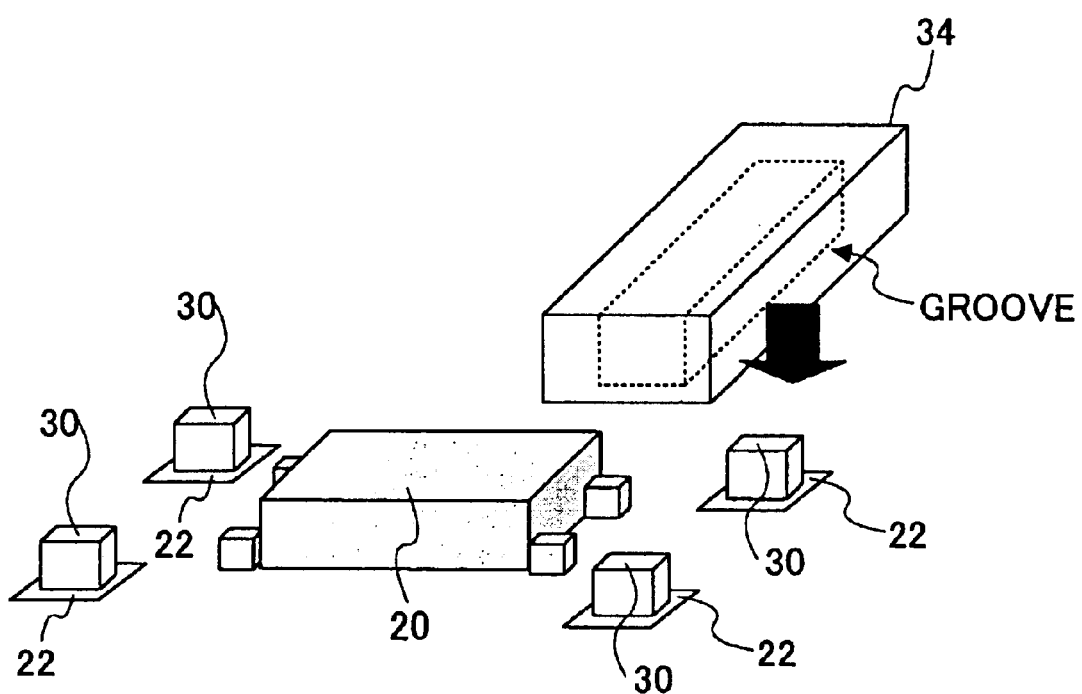
FIG. 5 is a perspective view of another example of the dummy parts according to the present invention.

FIG. 5 shows another example of the dummy part according to the present invention. As mentioned above, when the surface area of the circuit part 20 concerned is relatively large, it is difficult to control the rising of the surface temperature of the circuit part 20 only with the heat capacity of the dummy parts 30. In such a case, as shown in FIG. 5, a heat-absorption part 34 having a sufficiently large heat capacity and being configured to cover the two dummy parts 30 is additionally provided on the wiring board in the vicinity of the circuit part 20. The heat-absorption part 34 of the example, as shown in FIG. 5, has a groove formed on the bottom of the heat-absorption part 34, and the two adjacent dummy parts 30 are contained in the groove and fully covered with the heat-absorption part 34 when the heat-absorption part 34 is mounted on the wiring board.

At the time of the reflow heating of the printed wiring board device 10, the heat-absorption part 34 of the present embodiment is arranged near the circuit part 20 on the side of the printed wiring board device that faces toward the conveyance direction in which the printed wiring board device is transferred to and passed through the reflow equipment. According to the present embodiment, the effect which prevents the excessive heating of the circuit part 20 during the reflow soldering can be increased even when the surface area of the circuit part 20 is relatively large. Alternatively, the heat-absorption part 34 may be configured to surround the entire circumference of the circuit part 20.

Figure 7:
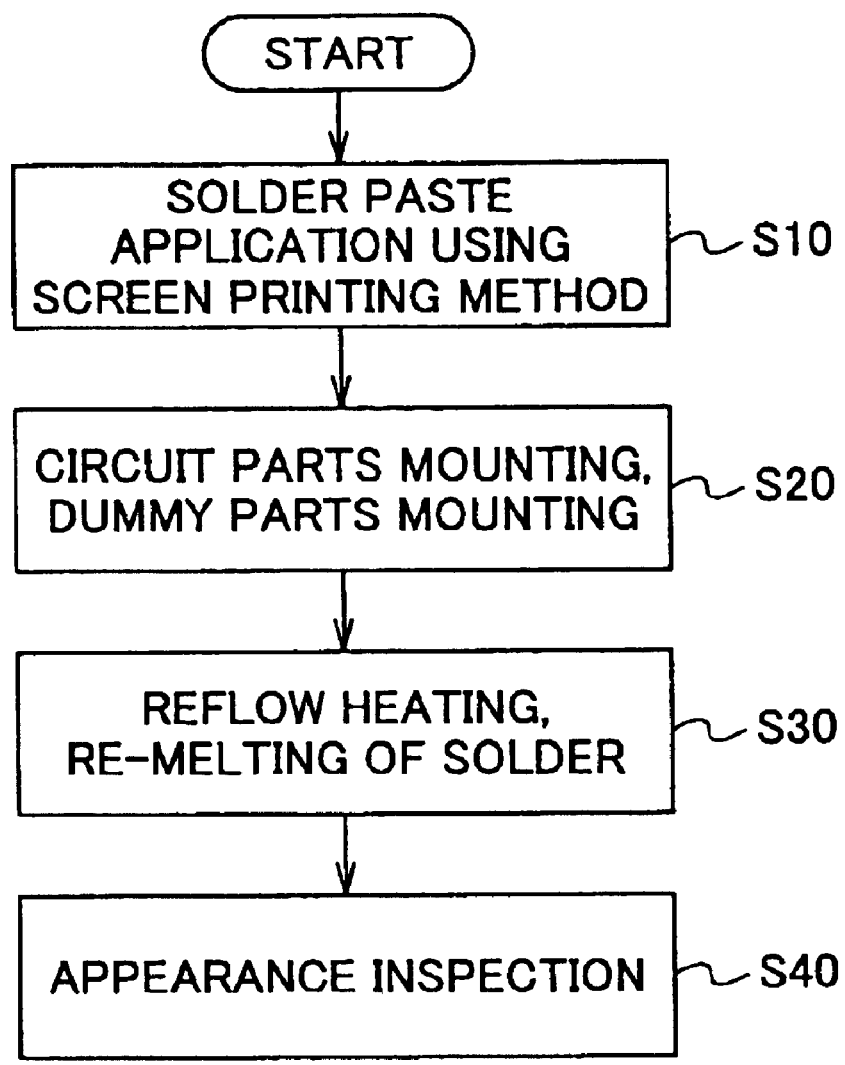
FIG. 7 is a flowchart for explaining a method of manufacture of the printed wiring board device according to the present invention.

FIG. 7 shows a method of manufacture of the printed wiring board device according to the present invention. FIG. 8 is a diagram for explaining each of respective steps of the manufacturing method in FIG. 7.

In the printed wiring board device of the present invention, it is supposed that the circuit parts 20 are mounted on the wiring board at positions isolated from other parts on the wiring board, and the circuit parts 20 constitute parts of a circuit in the printed wiring board device. According to the manufacture method of the printed wiring board device of the present embodiment, the preventive measures for preventing the temperature rise of the circuit parts 20 during the reflow soldering from exceeding the heat-resistant temperature of the circuit parts 20 are taken as described below.

In the manufacture method of this present embodiment, the pads 22 are electrically isolated from the circuit in the printed wiring board device 10 and are mounted on the wiring board in the vicinity of the circuit parts 20. The arrangement portions of the pads 22 in the printed wiring board device 10 are predetermined such that they are essentially the same as those of the previous embodiment. As shown in FIG. 7 and FIG. 8(A), the solder paste 41 is applied to the pads 22 on the printed wiring board device 10 by using a known method, such as a screen printing method (S10).

After the solder paste 41 is applied, the circuit parts 40 which should be mounted on the printed wiring board device 10 are mounted on the wiring board (S20), as shown in FIG. 7 and FIG. 8(B). The circuit parts 40 constitute parts of the circuit in the printed wiring board device 10. In this step S20, the dummy parts 30 are also mounted on the pads 22 of the printed wiring board device 10, similar to the circuit parts 40. Hence, the dummy parts 30 are mounted on the wiring board in the vicinity of the circuit parts 20.

After the mounting of the circuit parts 40 and the dummy parts 30 on the printed wiring board device 10 is performed, the printed wiring board device 10 is transferred to and passed through the reflow equipment, and the reflow soldering of the printed wiring board device 10 is performed by using the reflow equipment (S30). As shown in FIG. 8(C), the printed wiring board device 10 is heated by the heat convection and radiation within the reflow equipment, and the re-melting of the solder paste 41 is caused to produce solder junctions on the printed wiring board device 10. In this step S30, the dummy parts 30 absorb efficiently the heat from the circuit parts 20 through the pads 22 during the reflow soldering. Therefore, it is possible that the rising of the surface temperature of the circuit parts 20 is prevented from exceeding the heat-resistant temperature of the circuit parts 20. The manufacturing method of the present embodiment is effective in maintaining the circuit parts 20 in proper temperature conditions during the reflow soldering, and it is ensured that good solder junctions of the circuit parts 20 are made on the wiring board.

After the reflow heating step is performed, the appearance inspection of the printed wiring board device 10 is conducted, and the solder junctions of the individual parts thereof are inspected (S40), as shown in FIG. 7 and FIG. 8(D).

In order to prevent the rising of the surface temperature of the circuit parts 20 in the reflow heating step in the manufacture method of the printed wiring board device of the present embodiment from exceeding the heat-resistant temperature of the circuit parts 20, the dummy parts 30 are provided so that they have a sufficiently large heat capacity in comparison with the heat-resistant temperature of the circuit parts 20. It is preferred that the dummy parts 30 are configured so that they have a sufficiently large thermal conductivity as well as a sufficiently large heat capacity in comparison with the heat-resistant temperature of the circuit part 20. Moreover, in order to increase the effect which prevents the excessive heating of the circuit parts 20 during the reflow soldering, the plurality of such dummy parts 30 are arranged on the wiring board in the vicinity of the peripheral edges of the circuit parts 20. Furthermore, in order to more efficiently absorb the heat from the circuit parts 20 in the reflow heating step, it is desirable that the surfaces of the dummy parts 30 are colored substantially in black by painting or surface treatment.

Next, a description will be given of simulation tests which are performed to compare the heat absorption state of a target circuit part with the dummy parts according to the present invention and the heat absorption state of the target circuit part without the dummy parts.

Figure 9:
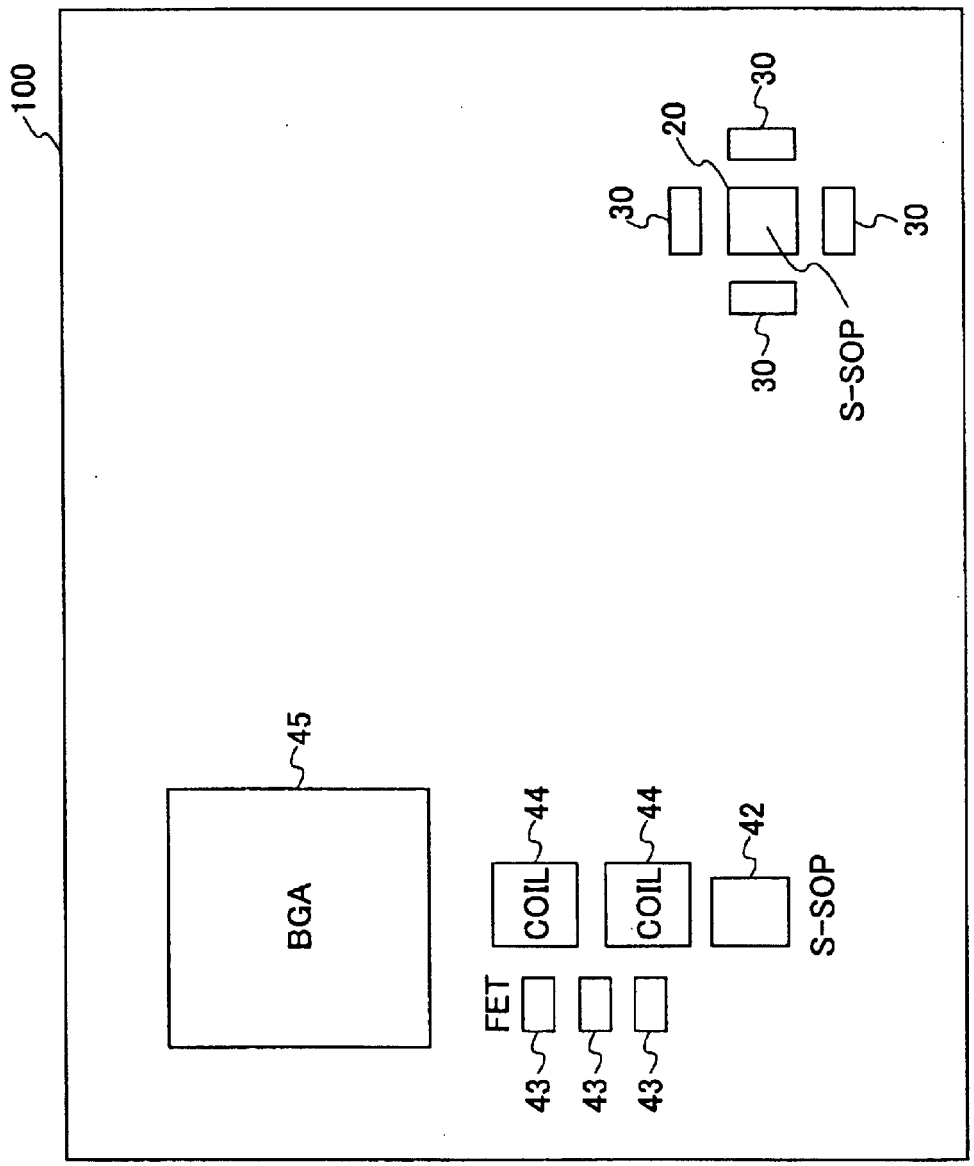
FIG. 9 is a plan view of a printed wiring board model that is used for a simulation test for comparison between the surface temperature of a target circuit part with the dummy parts and that of the target circuit part without the dummy parts.

FIG. 9 shows a printed wiring board model 100 that is used for a simulation test for comparison between the surface temperature of the target circuit part with the dummy parts and that of the target circuit part without the dummy parts.

As shown in FIG. 9, on the left-hand side of the printed wiring board model 100, the circuit parts which constitute parts of the circuit in the printed wiring board are provided as the non-isolated circuit parts. Such circuit parts include the 14-pin S-SOP (shrink small outline package) package 42, the three FET (field-effect transistor) transistors 43, the two coils 44, and the BGA (ball grid array) package 45. At the right-hand corner portion of the printed wiring board model 100, the 14-pin S-SOP package, which is essentially the same as the package 42, is provided as the isolated circuit part 20 that is mounted at the position isolated from the circuit parts 42–45. The S-SOP package 20 also constitutes a part of the circuit in the printed wiring board. It is assumed that the isolated arrangement of the S-SOP package 20 is needed according to the restrictions of the part arrangement.

In the printed wiring board model 100 of FIG. 9, the four dummy parts 30 are provided on the wiring board in the vicinity of the peripheral edges of the isolated circuit part 20 (the S-SOP package). Moreover, the size of the printed wiring board model 100 of FIG. 9 is about 120 mm×120 mm.

Figure 11:
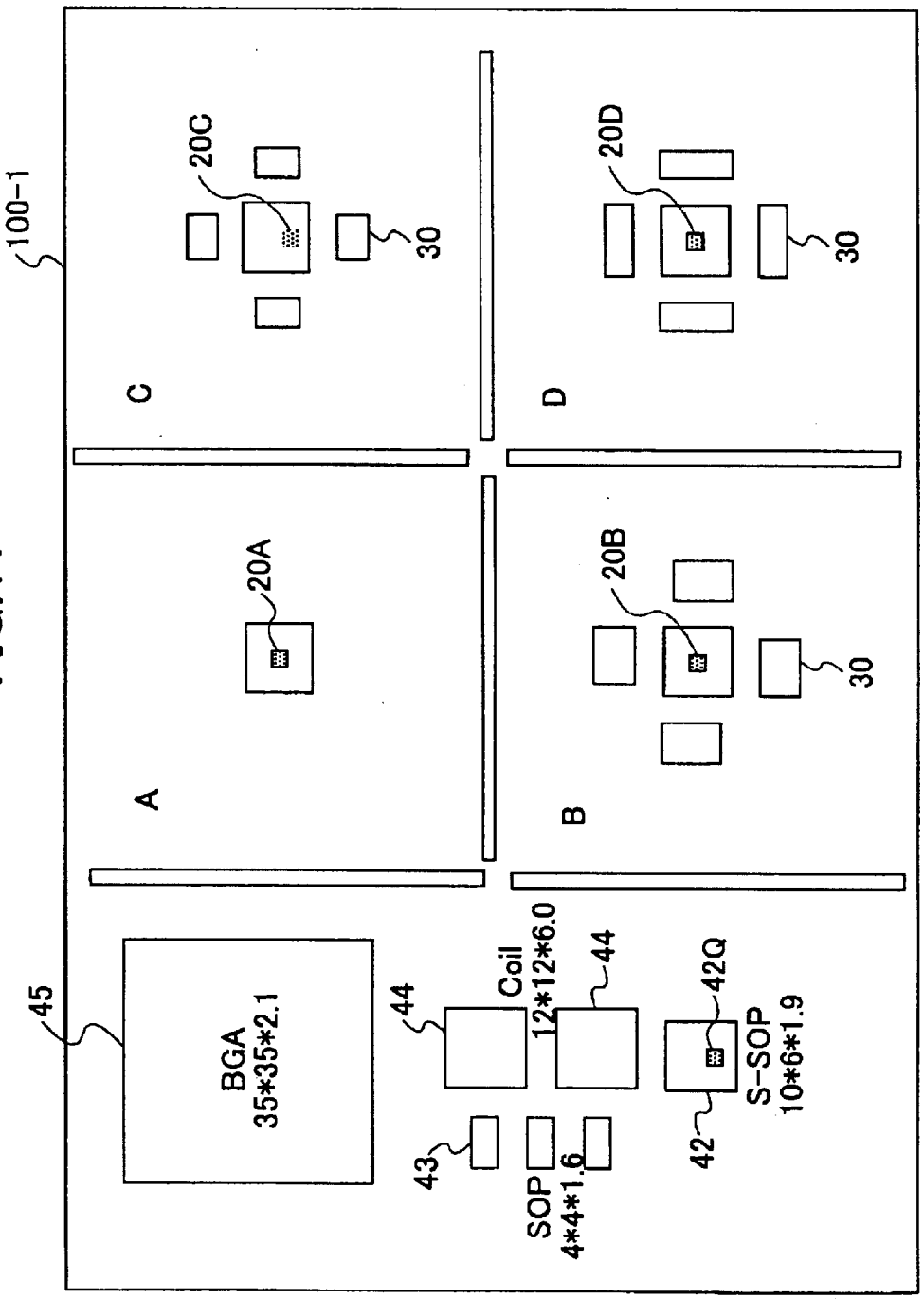
FIG. 11 is a plan view of the first example of the printed wiring board model for the simulation test.

FIG. 10 shows the surface temperature of the S-SOP and the physical properties of dummy parts in the vicinity of the S-SOP in each simulated result for a first example of the printed wiring board model. FIG. 11 is a plan view of the first example of the printed wiring board model for the simulation test.

As shown in FIG. 10 and FIG. 11, the Surface-A is the case where no dummy parts are provided in the vicinity of the isolated circuit part 20, and the Surface-B, the Surface-C, and the Surface-D are the cases where the dummy parts 30 which have different composition materials are provided, respectively, in the vicinity of the circuit part 20. In the "SURROUNDING PARTS OF S-SOP" column of the table in FIG. 10, the size of the coil 44 and the size of each of the respective dummy parts 30 of different composition materials are indicated. For example, "SOP" indicates the small outline package is used as the material of the dummy parts 30. "CHIP" indicates the chip capacitor or resistor is used as the material of the dummy parts 30. "SUS" indicates the stainless material is used as the composition material of the dummy parts 30. The "GAP" column of the table in FIG. 10 indicates that the gap between the coil 44 and the circuit part 42 or the gap between the dummy part 30 and the circuit part 20 is about 4 mm.

The "TEMP. OF PART" column of the table in FIG. 10 indicates the surface temperature of the S-SOP part 42 or part 20 when the simulation test of the reflow heating is performed. As a result, the temperature of the non-isolated circuit part 42 is 220 deg. C., the temperature of the circuit part 20 of the Surface-A wherein no dummy parts 30 are provided is 235 deg. C., and the respective temperatures of the circuit parts 20 of the Surface-B, the Surface-C and the Surface-D wherein the dummy parts 30 of the present invention are provided are decreased to 223 deg. C.–230 deg. C. It is readily understood that the dummy parts 30 of the present invention serve to efficiently absorb the heat from the circuit part 20 during the reflow heating.

Figure 12:
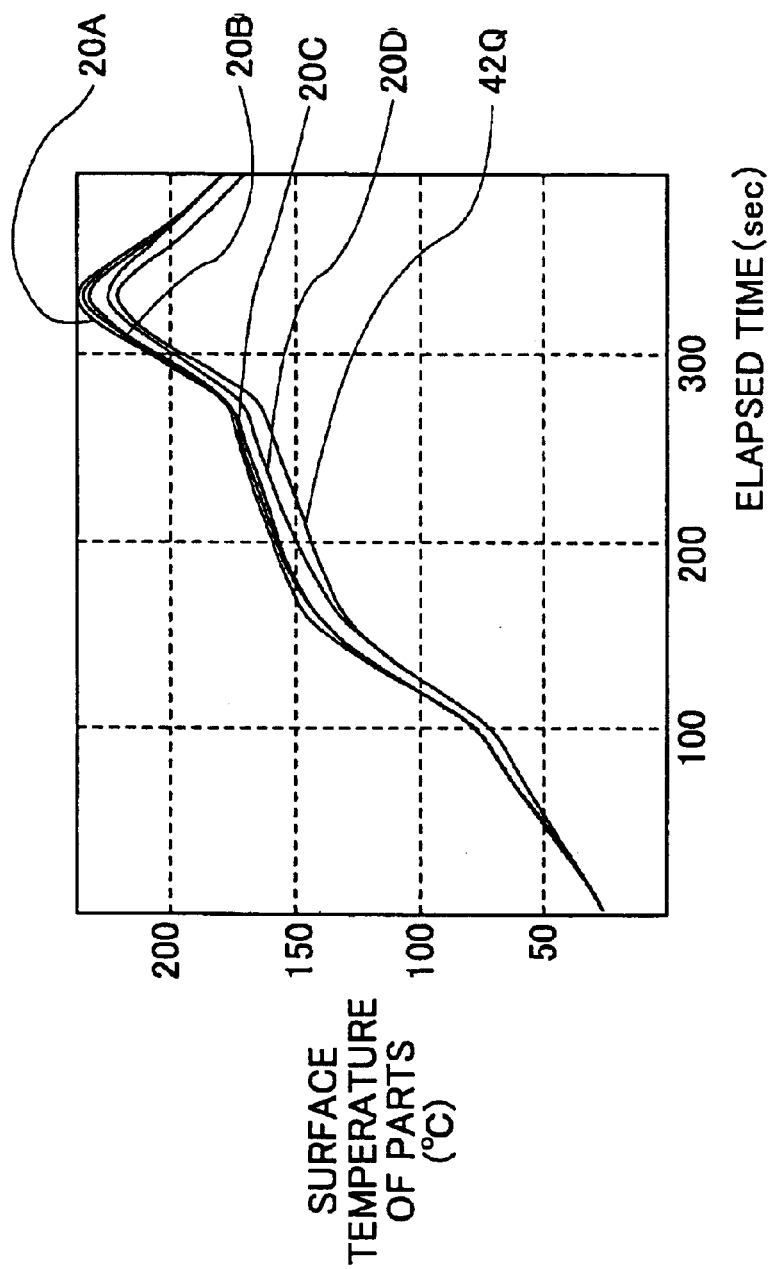
FIG. 12 is a diagram for explaining a change of the surface temperature of each of the circuit parts during the reflow heating which is obtained as simulation results of the first example of the printed wiring board model.

FIG. 12 shows a change of the surface temperature of each of the isolated circuit parts during the reflow heating which is obtained as simulation results of the first example of the printed wiring board model 100-1. In FIG. 11 and FIG. 12, "42Q" indicates the point of measurement of the surface temperature of the non-isolated circuit part 42, and "20A" through "20D" respectively indicate the points of measurement of the surface temperatures of the isolated circuit parts 20 of the Surface-A through the Surface-D in the printed wiring board model 100-1.

Figure 14:
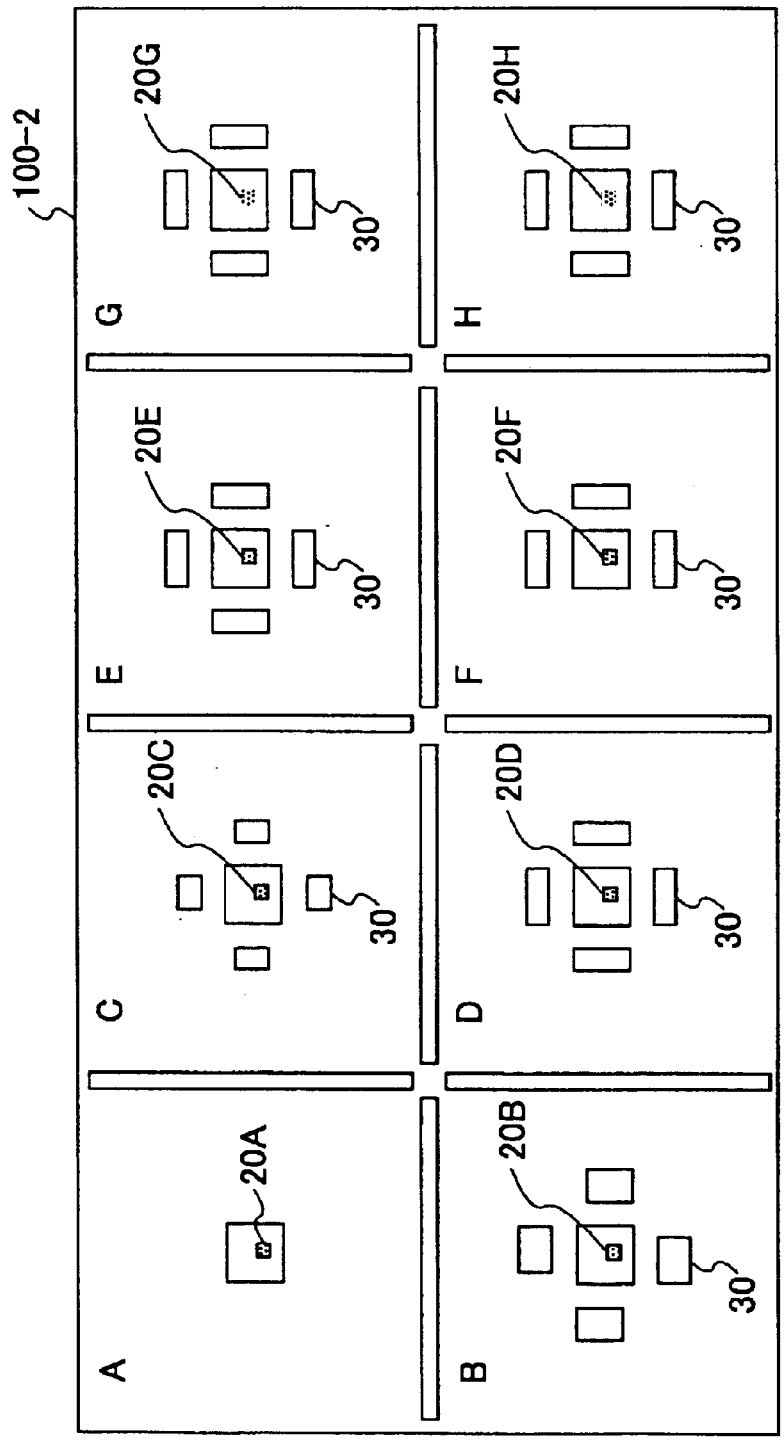
FIG. 14 is a plan view of the second example of the printed wiring board model for the simulation test.

Next, FIG. 13 shows the surface temperature of the S-SOP and the physical properties of dummy parts in the vicinity of the S-SOP in each simulated results of a second example of the printed wiring board model. FIG. 14 is a plan view of the second example of the printed wiring board model for the simulation test.

The composition material of the dummy parts 30 and the number thereof are changed, and the second example is provided to consider the change of the preventive effects that prevent the excessive heating of the isolated circuit part 20 during the reflow heating. For example, the heat capacity of the dummy parts 30 of the Surface-A through the Surface-H and the thermal conductivity thereof are varied, and the change of the preventive effects according to the dummy parts 30 is taken into consideration.

The "TEMP. OF PART" column of the table in FIG. 13 indicates the surface temperature of the S-SOP circuit parts 20 when the simulation test of the reflow heating is performed. As a result, the temperature of the circuit part 20 of the Surface-A wherein no dummy parts are provided is 235 deg. C., and the respective temperatures of the circuit parts 20 of the Surface-B through the Surface-H wherein the dummy parts 30 of the present invention are decreased to 223 deg. C.–230 deg. C. It is readily understood that the dummy parts 30 of the present invention serve to efficiently absorb the heat from the circuit part 20 during the reflow heating.

Moreover, it is found from the simulation results that the major factor influencing the effects that prevent the excessive heating of the circuit part 20 during the reflow heating is the heat capacity of the dummy parts 30.

Furthermore, it is found that, when the dummy parts 30 have the same heat capacity value, the preventive effects of the dummy parts 30 having a large thermal conductivity are higher than the preventive effects of the dummy parts 30 having a small thermal conductivity.

Accordingly, it is desirable to choose the composition material of the dummy parts 30 having a large specific heat value in order to ensure that the heat capacity of the dummy parts 30 is sufficiently large. When the volume of the dummy parts 30 is restricted, it is possible to compensate for the restriction of the volume by choosing the composition material of the dummy parts 30 having a large density value. As described previously, the heat capacity of each dummy part 30 can be computed as a product of the specific heat (J/kg-K) of the dummy part, the density (kg/m$^3$) of the dummy part and the volume (m$^3$) of the dummy part.

Figure 15:
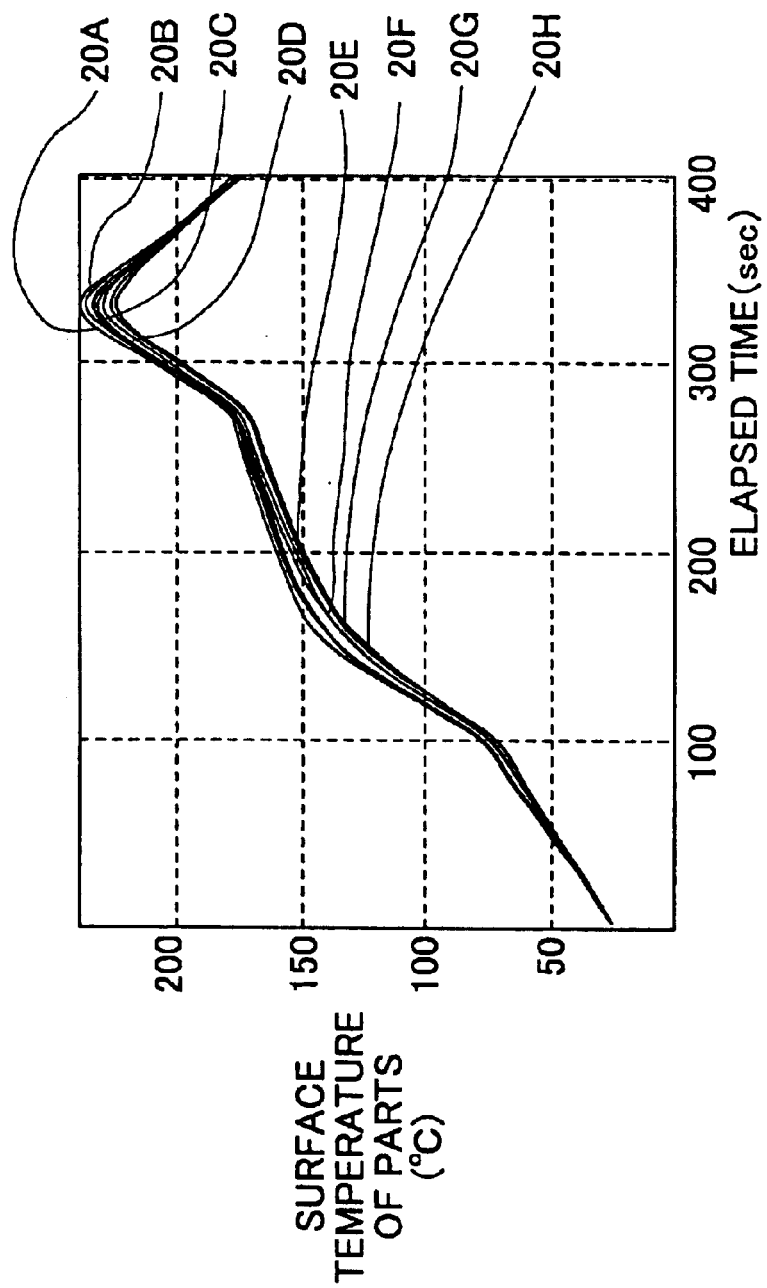
FIG. 15 is a diagram for explaining a change of the surface temperature of each of the circuit parts during the reflow heating which is obtained as simulation results of the second example of the printed wiring board model.

FIG. 15 shows a change of the surface temperature of each of the circuit parts during the reflow heating which is obtained as simulation results of the second example of the printed wiring board model. In FIG. 14 and FIG. 15, "20A" through "20H" respectively indicate the points of measurement of the surface temperatures of the circuit parts 20 of the Surface-A through the Surface-H in the printed wiring board model 100-2.

Figure 16:
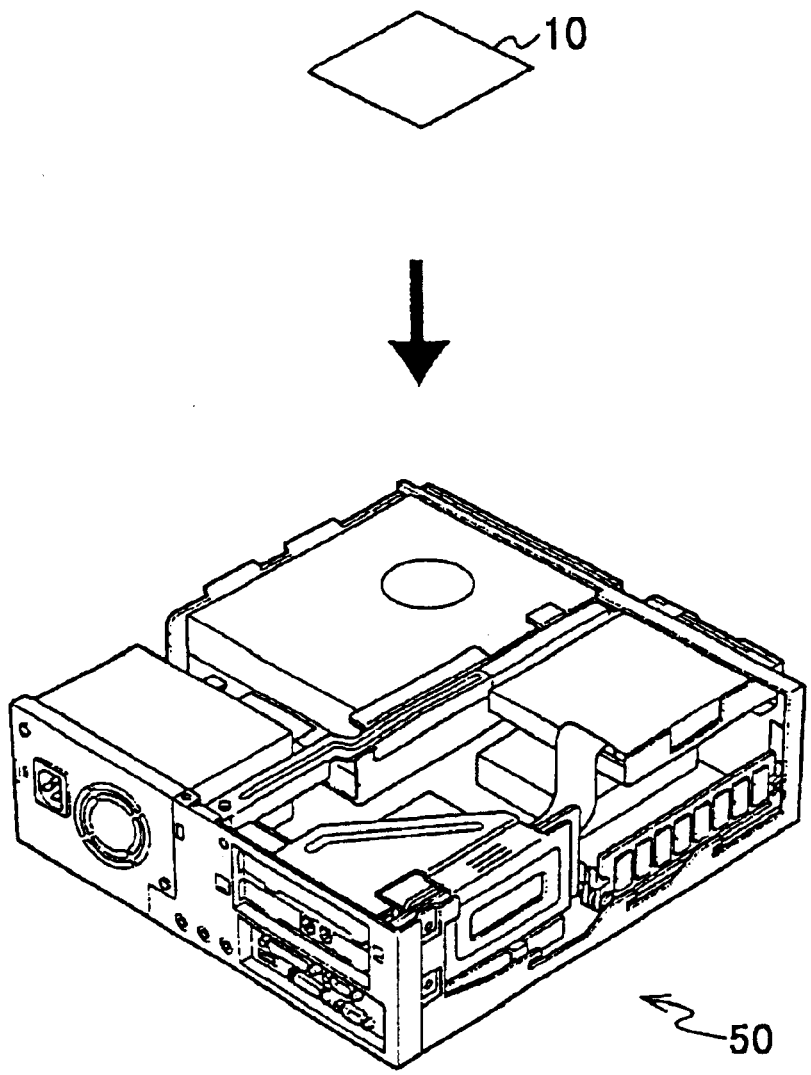
FIG. 16 is a diagram showing an information processing apparatus in which the printed wiring board device of the present invention is provided.

Next, FIG. 16 shows an example of an information processing apparatus in which the printed wiring board device according to the present invention is provided.

The example in FIG. 16 is a main component 50 of a personal computer in which the printed wiring board device 10 according to the previous embodiment of FIG. 1 or FIG. 4 is provided. The personal computer is provided as the information processing apparatus. The circuit parts provided on the printed wiring board device 10 constitutes parts of an information processing circuit (for example, a data reading circuit) which processes information. According to the restrictions of the arrangement of the parts on the printed wiring board device the isolated circuit parts 20 are arranged at positions isolated from other parts on the wiring board and constitute parts of the information processing circuit.

As described previously, in the printed wiring board device 10 according to the present invention, the pads are provided on the wiring board in the circumference of the circuit parts and electrically isolated from the circuit, and the dummy parts are mounted on the pads and absorb heat from the circuit parts through the pads during the reflow soldering. Even if the circuit parts having a low thermal resistance are needed to be isolated from other parts on the wiring board, it is possible to prevent the temperature rise of the circuit parts during the reflow soldering from exceeding the heat-resistant temperature thereof.

Accordingly, the printed wiring board device 10 in the present embodiment of the information processing apparatus is effective in maintaining the circuit parts in proper temperature conditions, and it can ensure that good solder junctions are made on the wiring board, similar to the previous embodiment of FIG. 1 or FIG. 4. It is possible for the present embodiment to provide an information processing apparatus that is equipped with the printed wiring board device in which good solder junctions are made on the wiring board without causing defects.

The present invention is not limited to the above-described embodiments, and variations and modifications may be made without departing from the scope of the present invention.

Further, the present invention is based on Japanese priority application No. 2001-381326, filed on Dec. 14, 2001, the entire contents of which are hereby incorporated by reference.

What is claimed is:

1. A printed wiring board device comprising:

circuit parts mounted on a wiring board and constituting parts of a circuit in the printed wiring board device;

pads provided on the wiring board in the circumference of the circuit parts and being electrically isolated from the circuit; and heat-absorbing dummy electronic parts that do not come in contact with the circuit parts and do not cover the circuit parts, mounted on the pads and absorbing heat from the circuit parts through the pads during reflow soldering.

2. The printed wiring board device according to claim 1, wherein the dummy parts are mounted in the circumference of one of the circuit parts that receives during reflow heating a largest amount of heat among respective amounts of heat received by the circuit parts on the wiring board, the largest amount of heat being excessive over an amount of heat needed for solder melting.

3. The printed wiring board device according to claim 1, wherein a plurality of the dummy parts are disposed in the vicinity of peripheral edges of one of the circuit parts.

4. The printed wiring board device according to claim 1, wherein the dummy parts are made of one of alumina, copper, an aluminum alloy and a stainless material.

5. The printed wiring board device according to claim 1, wherein a heat-absorption part having a sufficiently large thermal conductivity in comparison with a heat-resistant temperature of the circuit parts is attached to each dummy part by using an adhesive agent or a mechanical junction.

6. A printed wiring board device comprising:

circuit parts mounted on a wiring board at positions isolated from other parts on the wiring board, the circuit parts constituting parts of a circuit in the printed wiring board device; and heat-absorbing dummy electronic parts mounted on the wiring board by using an adhesive agent that is thermally conductive, the dummy parts do not come in contact with the circuit parts and do not cover the circuit parts and absorbs heat from the circuit parts through the adhesive agent during reflow soldering.

7. The printed wiring board device according to claim 6, wherein the dummy parts are made of one of alumina, copper, an aluminum alloy and a stainless material.

8. The printed wiring board device according to claim 6, wherein a heat-absorption part having a sufficiently large thermal conductivity in comparison with a heat-resistant temperature of the circuit parts is attached to each dummy part by using an adhesive agent or a mechanical junction.

9. The printed wiring board device according to claim 6, wherein the dummy parts are fixed to the wiring board by using the adhesive agent or a mechanical junction.

10. An information processing apparatus in which a printed wiring board device is provided, the printed wiring board device comprising:

circuit parts mounted on a wiring board and constituting parts of a circuit in the printed wiring board device;

pads provided on the wiring board in the circumference of the circuit parts and being electrically isolated from the circuit; and heat-absorbing dummy electronic parts that do not come in contact with the circuit parts and do not cover the circuit parts, mounted on the pads and absorbing heat from the circuit parts through the pads during reflow soldering.

* * * * *